United States Patent
Chang

(10) Patent No.: US 7,220,497 B2
(45) Date of Patent: May 22, 2007

(54) YTTRIA-COATED CERAMIC COMPONENTS OF SEMICONDUCTOR MATERIAL PROCESSING APPARATUSES AND METHODS OF MANUFACTURING THE COMPONENTS

(75) Inventor: Chris Chang, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 204 days.

(21) Appl. No.: 10/737,917

(22) Filed: Dec. 18, 2003

(65) Prior Publication Data

US 2005/0136188 A1  Jun. 23, 2005

(51) Int. Cl.
- *B32B 9/00* (2006.01)
- *C23C 16/00* (2006.01)
- *H01L 21/00* (2006.01)

(52) U.S. Cl. ............... 428/701; 428/702; 428/698; 118/723 R; 438/706; 438/798

(58) Field of Classification Search .......... None
See application file for complete search history.

(56) References Cited

U.S. PATENT DOCUMENTS

| | | | |
|---|---|---|---|
| 4,525,464 A | * | 6/1985 | Claussen et al. ......... 501/103 |
| 6,123,791 A | | 9/2000 | Han et al. |
| 6,606,234 B1 | | 8/2003 | Divakar |
| 2002/0009560 A1 | | 1/2002 | Ozono |
| 2002/0018921 A1 | | 2/2002 | Yamada et al. |
| 2003/0059653 A1 | | 3/2003 | Yamada et al. |
| 2003/0186034 A1 | | 10/2003 | Yamada |

OTHER PUBLICATIONS

Co-pending U.S. Appl. No. 09/607,922, filed Jun. 30, 2000.
L. Pawlowski, "The Science and Engineering of Thermal Spray Coatings", (John Wiley & Sons, 1996).
Co-pending U.S. Appl. No. 10/180,504, filed Jun. 27, 2002.
Written Opinion dated Jun. 20, 2006 for PCT US04/41206.

* cited by examiner

*Primary Examiner*—Jennifer McNeil
*Assistant Examiner*—Timothy M. Speer
(74) *Attorney, Agent, or Firm*—Buchanan Ingersoll & Rooney PC

(57) ABSTRACT

Yttria-coated ceramic components of semiconductor material processing apparatuses include a substrate and at least one yttria-containing coating on the substrate. The components are made by applying a first yttria-containing coating on a ceramic substrate, which can be a green body of the ceramic material. The coated green body is sintered. The first yttria-containing coating can be treated to remove attached yttria particles resulting from the sintering. In another embodiment, a second yttria-containing coating can be thermally sprayed on the first yttria-containing coating to cover the particles.

11 Claims, 3 Drawing Sheets ial processing apparatus comprises co-sintering the substrate and the as-thermal sprayed yttria-containing coating to form a bond layer comprising a multi-phase oxide of the ceramic material and yttria at an interface between the substrate and the yttria-containing coating.

YTTRIA-COATED CERAMIC COMPONENTS OF SEMICONDUCTOR MATERIAL PROCESSING APPARATUSES AND METHODS OF MANUFACTURING THE COMPONENTS

BACKGROUND

In the field of semiconductor material processing, semiconductor material processing apparatuses including vacuum processing chambers are used, for example, for etching and chemical vapor depositing (CVD) of various materials on substrates, and resist stripping. Such processes include supplying process gas to the vacuum chamber and applying an RF field to the gas to generate plasma. Due to the corrosive nature of the process gases and plasma in such processing chambers, and the desire to minimize particle and/or metal contamination of substrates processed in the chambers, it is desirable that plasma-exposed components of such apparatuses are erosion and corrosion resistant to such gases and plasma.

SUMMARY

Yttria-coated ceramic components of a semiconductor processing apparatus are provided. A preferred embodiment of a yttria-coated ceramic component comprises a substrate comprised of a green body of a ceramic material; and a thermal-sprayed yttria-containing coating on at least one surface of the substrate.

The substrate can comprise various ceramic materials. In a preferred embodiment, the substrate comprises alumina. The yttria-containing coating can consist essentially of yttria, or it can further comprise one or more additional compounds.

The component can be, for example, a dielectric window, chamber wall, chamber liner, substrate support, baffle, gas distribution plate, plasma confinement ring, nozzle, fastener, heating element, plasma focus ring, chuck, or a plasma screen of a semiconductor material processing apparatus.

Another preferred embodiment of a yttria-coated ceramic component of a semiconductor material processing apparatus comprises a substrate comprised of a ceramic material; a thermal-sprayed first yttria-containing coating on the substrate; and a bond layer comprising a multi-phase oxide of the ceramic material and yttria at an interface between the substrate and the first yttria-containing coating. The bond layer having been formed by co-sintering the substrate and the as-thermal-sprayed first coating. In another preferred embodiment, an exposed surface of the yttria-containing coating can be treated by a plasma conditioning treatment to reduce particles of yttria attached to the exposed surface after the co-sintering. In yet another preferred embodiment, an as-thermal sprayed second yttria-containing coating can be provided on the sintered first yttria-containing coating to cover the yttria particles.

In a preferred embodiment of the yttria-coated ceramic component, the second yttria-containing coating can have a surface roughness that is effective to enhance adhesion of deposits to the surface.

A preferred embodiment of a method of making a yttria-coated ceramic component of a semiconductor material processing apparatus comprises thermal spraying a yttria-containing coating on at least one surface of a substrate, which is a green body of a ceramic material.

Another preferred embodiment of a method of making a yttria-coated ceramic component of a semiconductor mate- Still another preferred embodiment of a method of making a yttria-coated ceramic component of a semiconductor material processing apparatus comprises, after the co-sintering, thermal spraying a second yttria-containing coating on the yttria-containing coating.

Another preferred embodiment of a method of making a yttria-coated ceramic component of a semiconductor material processing apparatus comprises treating an exposed surface of the yttria-containing coating by a plasma conditioning treatment to reduce particles of yttria attached to the exposed surface after the co-sintering.

DETAILED DESCRIPTION

Yttrium oxide (yttria)-coated ceramic components of semiconductor material processing apparatuses are provided. Yttria-containing coatings of the ceramic components are wear resistant with respect to physical and/or chemical attack by corrosive gases and plasmas present in plasma processing chambers of semiconductor material processing apparatuses during processing of substrates. As used herein, the term "wear resistant" includes, but is not limited to, resistance to erosion, corrosion and/or corrosion-erosion resulting from process gas, plasma or plasma by-products.

Preferred embodiments of the yttria-coated ceramic components comprise at least one yttria-containing coating forming an outer surface of the components and that is resistant to chemical and/or physical attack by corrosive gases and plasmas in apparatuses for processing semiconductor materials. Such apparatuses can be used for etching, deposition (e.g., CVD, PECVD and the like), or resist stripping processes used in the manufacture of semiconductor substrates, e.g., semiconductor wafers, flat panel display substrates, and the like.

The yttria-coated ceramic components can be various components that are exposed to plasma and/or corrosive gases in semiconductor material processing apparatuses. Such exemplary components can include, but are not limited to, parts of a plasma and/or vacuum chamber (e.g., a plasma etcher), such as dielectric windows, chamber walls, chamber liners, substrate supports, baffles, gas distribution plates, gas distribution rings, chucking mechanisms (e.g., electrostatic chucks), focus rings, nozzles, fasteners, heating elements, plasma screens, and the like.

Figure 1:
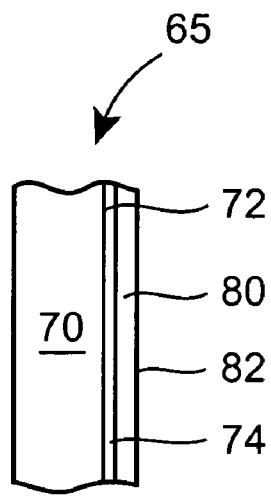
FIG. 1 shows a preferred embodiment of a yttria-coated ceramic component including a substrate and a yttria-containing coating on the substrate.

As shown in FIG. 1, a preferred embodiment of a yttria-coated component 65 includes a substrate 70 comprised of a ceramic material, and a thermal-sprayed yttria-containing coating 80 on at least the surface 72 of the substrate. The ceramic material of the substrate 70 can include, for example, stoichiometric and non-stoichiometric alumina ($Al_2O_3$), quartz, zirconia, silicon carbide (SiC), silicon nitride ($Si_3N_4$), boron carbide ($B_4C$), boron nitride (BN), aluminum nitride, or mixtures thereof. In a preferred embodiment, the ceramic material is alumina.

The substrate 70 of the yttria-coated ceramic component 65 can be manufactured, for example, by preparing a slurry of the ceramic material, and forming a green body from the slurry in a desired shape, such as by a compaction technique, slip casting and the like. Binders and other suitable additives can also be included in the slurry. The green compact is preferably formed in the shape of the desired component. In a preferred embodiment, the yttria-containing coating 80 is thermal sprayed on one or more surfaces of the green body, i.e., without partially or fully sintering the ceramic material to develop partial or full mechanical strength prior to the thermal spraying.

Another preferred embodiment comprises partially sintering the substrate 70 before thermal spraying the yttria-containing coating 80 on one or more surfaces of the substrate. For example, the substrate can be partially sintered at a temperature of from about 800° C. to about 1600° C. The sintering time can vary depending on factors including the component size and shape, and the desired density level to be achieved by sintering, e.g., about 60% to about 80% of full density. For example, the sintering time can range about one hour to several days to achieve partial mechanical strength in the component prior to thermal spraying the yttria-containing coating on the substrate. Details of exemplary ceramic processing techniques that can be used to form and densify the substrate are described, for example, in the *Engineered Materials Handbook®*, Volume 4, Sections 3 and 4, pp. 123–304 (ASM International, 1991), which is hereby incorporated by reference in its entirety.

The yttria-containing coating 80 applied on the substrate 70, as well as one or more additional yttria-containing coatings that can be applied over the first-applied yttria-containing coating 80 as described below, preferably are formed by thermal spraying only yttria onto a surface. The yttria-containing coatings of the components can also include various compounds, such as one or more oxide, carbide, nitride, boride and/or carbonitride of at least one of La, Ce, Pr, Nd, Pm, Sm, Eu, Gd, Tb, Dy, Ho, Er, Tm, Yb and Lu. To try to minimize the contamination of substrates processed in plasma processing apparatuses including one or more of the yttria-coated ceramic components, the yttria-containing coatings are preferably of the high purity. For example, the yttria-containing coatings preferably contain minimal amounts of elements that can potentially contaminate substrates, such as semiconductor wafers. Such elements include transition metals, alkali metals, and the like. In preferred embodiments, the yttria-containing coatings can be sufficiently pure to avoid on-wafer contamination of $10^{10}$ atoms/cm$^2$ or higher, preferably $10^5$ atoms/cm$^2$ or higher. Preferably, the yttria-containing materials have a purity of at least about 99%, and more preferably from about 99.95% to about 100%.

The substrate 70 and the yttria-containing coating 80 applied on the substrate are preferably co-sintered under conditions that are effective to produce a bond layer 74 at an interface between the substrate 70 and the yttria-containing coating 80 and to fully sinter the substrate. The bond layer 74 provides enhanced bonding strength of the applied yttria-containing coating 80 to the substrate 70. The co-sintering is preferably conducted at a temperature of from about 800° C. to about 1500° C. for a time period up to about seven days. The co-sintering can be conducted in a vacuum atmosphere or in an inert gas atmosphere. The composition and structure of the bond layer 74 formed between the substrate 70 and yttria-containing coating 80 depends on the ceramic material of the substrate. For example, in embodiments where the substrate is alumina, the bond layer can include multi-phase oxide structures that include yttria and alumina, such as $3Y_2O_3\text{-}5Al_2O_3$ and/or $Y_2O_3\text{-}Al_2O_3$. In embodiments where the substrate is zirconia, the bond layer can include $Y_2Zr_2O_7$, for example.

The co-sintering process can produce a surface finish on the yttria-containing coating 80 that is substantially free of micro-fractures, which can cause particle generation due to thermal cycling fatigue encountered by components in plasma processing apparatuses during plasma processing.

It has been determined, however, that the as-sintered yttria-containing coating 80 applied on the substrate 70 can include yttria particles attached to the exposed outer surface 82 of this coating. These yttria particles can potentially be removed by exposure to plasma during plasma processing and, as a result, contaminate substrates. In a preferred embodiment, the exposed surface 82 of the yttria-containing coating 80 formed on the substrate 70 of the co-sintered component is treated by a plasma conditioning treatment to reduce attached particles of yttria attached to the exposed surface. Suitable plasma conditioning treatments for removing such attached yttria particles from the exposed surface 82 are described in co-pending U.S. patent application Ser. No. 09/607,922, which is incorporated herein by reference in its entirety. The plasma conditioning can be performed by installing the component 65 in a plasma processing chamber of a semiconductor material processing apparatus and plasma conditioning the component to remove yttria particles from the exposed yttria-containing surface 82 before processing any production wafers with the component 65 present in the chamber.

Figure 2:
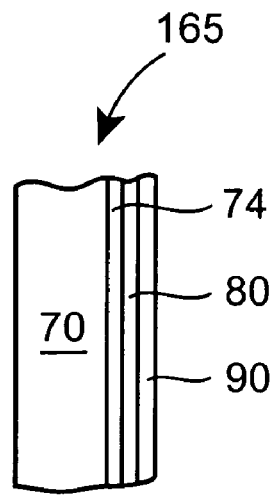
FIG. 2 shows another preferred embodiment of a yttria-coated ceramic component including a substrate, a first yttria-containing coating on the substrate, and a second yttria-containing coating on the first yttria-containing coating.

Another preferred embodiment of a yttria-coated ceramic component 165 is shown in FIG. 2. In this embodiment, the yttria particles on the exposed surface 82 of the yttria-coated substrate 70 are covered by thermally spraying at least one additional yttria-containing coating 90 over the yttria-containing coating 80 on the substrate 70. The outer yttria-containing coating 90 has a sufficient thickness to cover the yttria particles on the exposed surface 82 of the underlying yttria-containing coating 80 so that the yttria particles are not exposed to plasma when the component 165 is installed in a plasma chamber.

Plasma spraying is a preferred thermal spraying technique for applying the yttria-containing coating 80 on the substrate 70, as well as additional overlying yttria-containing coatings (e.g., coating 90). Plasma spraying techniques are described, for example, in L. Pawlowski, *The Science and Engineering of Thermal Spray Coatings* (John Wiley & Sons, 1996), which is hereby incorporated by reference in its entirety.

The thermal-sprayed yttria-containing coatings can have an as-sprayed thickness of from about 0.001 inch to about 1 inch, preferably from about 0.001 inch to about 0.5 inch, and more preferably from about 0.001 inch to about 0.01 inch. The thickness of the yttria-containing coatings can be selected to be compatible with the plasma environment to be encountered (e.g., etching, deposition, or resist stripping).

The thermal-sprayed yttria-containing coating 80 can be formed directly on the substrate 70 with or Without having previously roughened the substrate surface 72 and without intermediate coatings to promote adhesion of the coatings. In a preferred embodiment, the yttria-containing coating 80 provides suitable adherence to the substrate 70 without prior roughening of the substrate and/or forming intermediate layers, thus obviating additional process steps. The yttria-containing coating 80 has a high bond strength to the underlying substrate 70. Preferably, the yttria-containing coatings have a tensile bond strength of from about 200 ksi to about 400 ksi.

The thermal sprayed yttria-containing coatings can be formed with desired surface roughness characteristics, and can have a surface roughness ranging from smooth to rough. Rough yttria-containing surfaces can be effective to improve the adhesion of deposits, such as polymer deposits, resulting from the use of polymer forming species (e.g., fluorocarbons) during plasma etching processes, e.g., metal etching processes. As described in co-pending U.S. patent application Ser. No. 09/749,917, which is incorporated herein by reference in its entirety, such polymer deposits can come off of chamber surfaces during etching processes and contaminate substrates within the chamber. Thermal cycling that occurs during repeated plasma processing cycles can exacerbate this problem.

The thermal sprayed yttria-containing coatings can have arithmetic mean surface roughness (Ra) values ranging from about 5 to about 500 micro-inches, and preferably from about 120 to about 250 micro-inches. Surface roughness values in this preferred range can enhance the adhesion of polymers that are deposited on interior surfaces of the reaction chamber during plasma etching process, thereby reducing the occurrence of contamination of processed substrates by the polymer deposits.

The yttria-containing coatings can have low porosity levels, which can minimize contact of aggressive atmospheres with the underlying substrate, and thus also subsequent physical and/or chemical attack by corrosion, erosion and/or corrosion-erosion of the substrate by such aggressive atmospheres. Preferably, the yttria-containing coatings have a porosity of less than 20% by volume, more preferably less than about 5% by volume.

In addition, the yttria-containing coatings can have a sufficient hardness to resist erosion.

The yttria-containing coatings have a crystal structure that is preferably from about 10% to about 100% cubic, and more preferably from about 95% to about 100% cubic.

The yttria-containing coatings can provide desirable wear resistance properties for use in semiconductor processing apparatus, such as, e.g., plasma etch chambers. In particular, the yttria-containing coatings provide surfaces that can reduce ion induced erosion and associated levels of particulate contamination in plasma reactor chambers. The yttria-containing coatings can also protect underlying substrates against both physical attack and chemical attack by plasmas.

The yttria-coated ceramic components can be used in various plasma atmospheres for etching, deposition, resist stripping, and other applications. Typical etch chemistries may include, for example, chlorine containing gases including, but not limited to, $Cl_2$, HCl and $BCl_3$; bromine containing gases including, but not limited to, $Br_2$ and HBr; oxygen containing gases including, but not limited to, $O_2$, $H_2O$ and $SO_2$; fluorine containing gases including, but not limited to, $CF_4$, $CH_2F_2$, $NF_3$, $CH_3F$, $C_2F_6$, $CHF_3$ and $SF_6$; and inert and other gases including, but not limited to He, Ar and $N_2$. These and other gases may be used in any suitable combination, depending on the desired plasma. Suitable flow rates of the various process gases can be selected based on factors including, but not limited to, the type of plasma reactor, power settings, chamber pressure, plasma dissociation rates, etch chemistries, materials etched, and the particular step of the etch process in which the process gas is used.

The yttria-coated ceramic components can be used in etch chambers of semiconductor processing equipment for etching silicon-containing and metal-containing materials in semiconductor plasma etching processes. For example, silicon-containing materials that can be etched in such etch chambers include, but are not limited to, single-crystal silicon, polycrystalline silicon, amorphous silicon, silicon nitride, silicon oxynitride, silicides, silicon dioxide, low-k materials, and high-k materials. The silicon-containing materials can doped or un-doped and/or annealed or un-annealed. Strained Si can also be used.

Conductive or semiconductive metal-containing materials that can be etched include, but are not limited to, aluminum, aluminum alloys, copper, copper alloys, tungsten, tungsten alloys, titanium, titanium alloys, tantalum, tantalum alloys, platinum, platinum alloys, ruthenium, ruthenium alloys, chrome, chrome alloys, iron, iron alloys, nickel, nickel alloys, cobalt, cobalt alloys, molybdenum, molybdenum alloys, silicides of titanium, tungsten, chrome, cobalt and/or molybdenum, ferroelectric materials, such as platinum silicide and ruthenium oxide, and GMR materials, such as tantalum nitride, chrome silicide and NiFeCo alloys.

Figure 3:
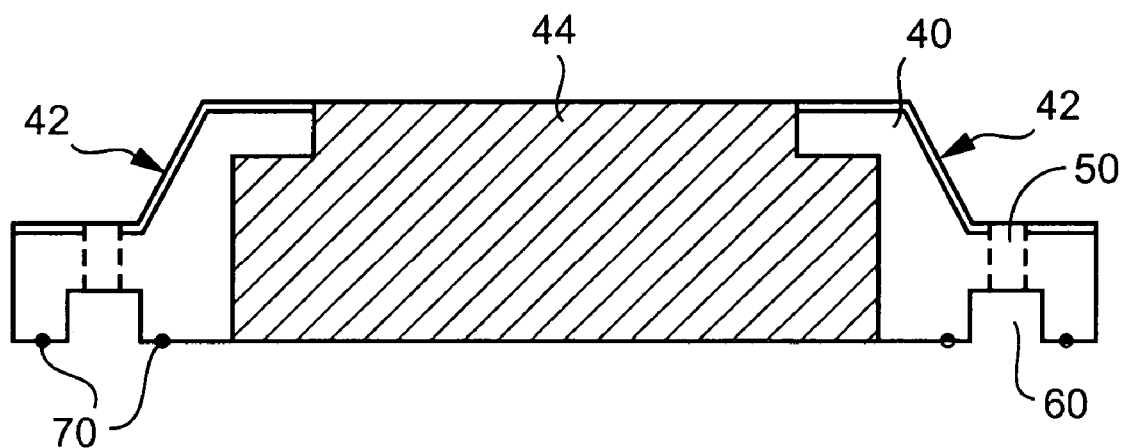
FIG. 3 is a cross-sectional view of an embodiment of a gas ring apparatus for a polysilicon etching apparatus.

The yttria-coated ceramic components can be used as reactor components in a polysilicon high-density plasma reactor, for example. An exemplary reactor of this type is the TCP 9400™ plasma etch reactor available from Lam Research Corporation of Fremont, Calif. In this reactor, processing gases (e.g., $Cl_2$, HBr, $CF_4$, $CH_2F_2$, $O_2$, $N_2$, Ar, $SF_6$ and $NF_3$) are supplied into a gas ring located on the bottom of the etch chamber and then flowed through gas holes into the reactor chamber. FIG. 3 shows a cross-sectional view of a gas ring for a TCP 9400™ polysilicon etch reactor. As shown in FIG. 2, the main body of the gas ring 40 surrounds a substrate support 44. The bottom surface of the gas ring 40 contains a ring-shaped gas-guiding trench 60. Gas holes 50 extend into the gas-guiding trench 60. A high-density plasma is generated by inductively coupling RF energy from a coil through a dielectric shield into the interior of the chamber.

The gas ring 40 is typically composed of aluminum. The upper surfaces of the gas ring are directly exposed to plasma and thus subject to erosion. To protect these surfaces, the gas ring can be a yttria-coated ceramic component including an exposed yttria-containing coating 42. Other components of such polysilicon etch reactors that are exposed to plasma during processing can also be yttria-coated ceramic components. These components include chamber walls, chamber liners, chucking devices, and dielectric windows.

Figure 4:
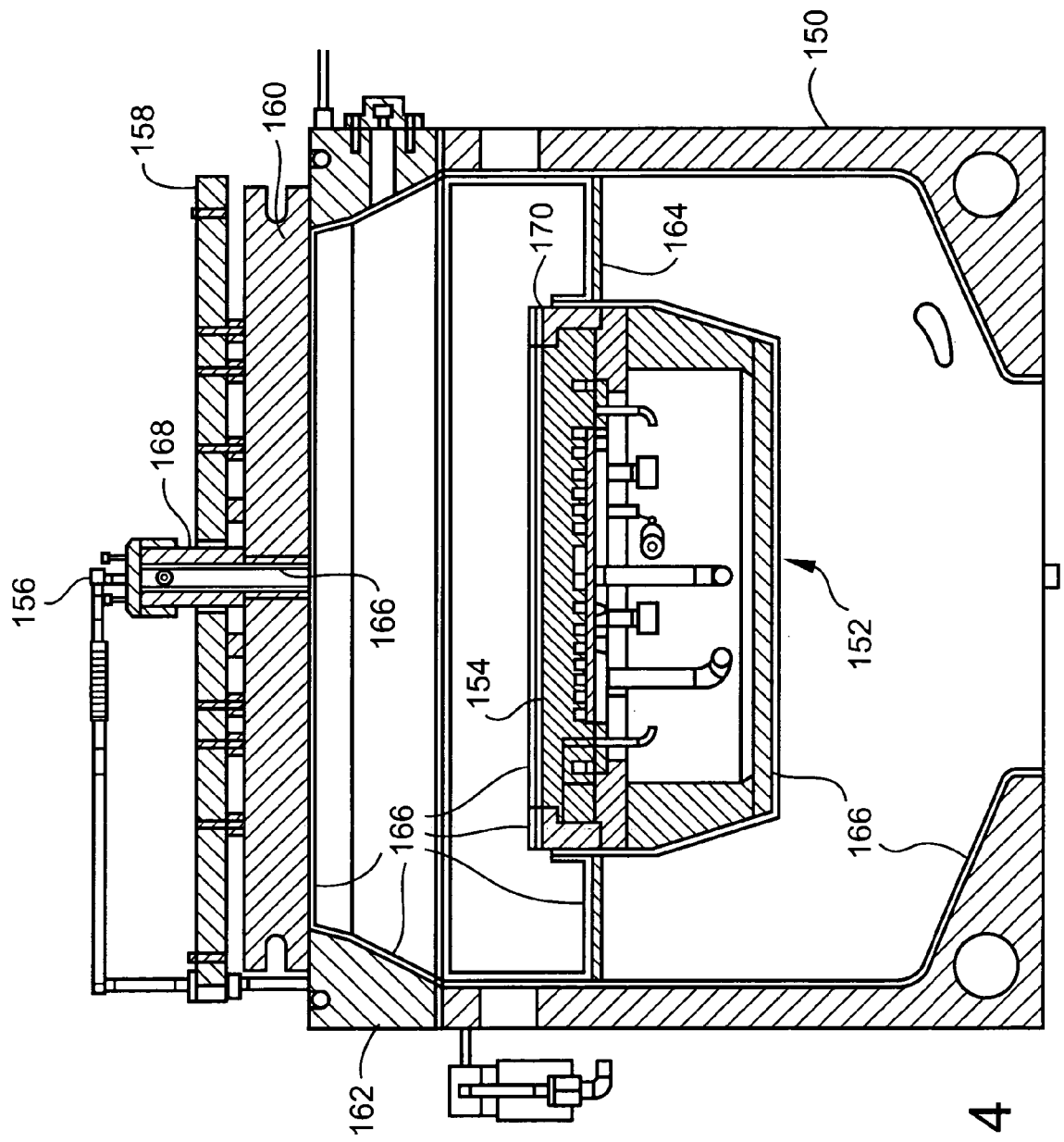
FIG. 4 shows a polysilicon etch chamber containing embodiments of components yttria-coated ceramic components.

Another exemplary polysilicon etch reactor is the Versys™ Polysilicon Etcher or 2300™ etcher, which is also available from Lam Research Corporation of Fremont, Calif. FIG. 4 shows a cross-sectional view of a 2300™ polysilicon etch reactor that includes a substrate support 152 having an electrostatic chuck 154, which provides a clamping force to a substrate when mounted thereon. A plasma focus ring 170 is shown mounted on substrate support 152 around electrostatic chuck 154. The substrate support 152 can also be used to apply an RF bias to the substrate. The substrate can be back-cooled using a heat transfer gas. In the 2300™ etcher, processing gases (e.g., $Cl_2$, HBr, $CF_4$, $CH_2F_2$, $O_2$, $N_2$, Ar, $SF_6$ and $NF_3$) are introduced into the chamber 150 via a gas injector 168 connected to a gas feed 156. The gas injector 168 is typically made of quartz or a ceramic material such as alumina. As shown, an inductive coil 158 can be powered by a suitable RF source to provide a high density plasma. The inductive coil 158 couples RF energy through the dielectric window 160 into the interior of chamber 150. The dielectric window 160 is typically made of quartz or alumina. The dielectric window 160 is shown mounted on an annular member 162, which spaces the dielectric window 160 from the top of the chamber 150 and is referred to as a gas distribution plate. A chamber liner 164 surrounds the substrate support 152. The chamber 150 can also include suitable vacuum pumping apparatus for maintaining the interior of the chamber at a desired pressure.

In the exemplary embodiment shown in FIG. 3, certain reactor components, such as the annular member 162, the dielectric window 160, the substrate support 152, the chamber liner 164, the gas injector 168, the focus ring 170, and/or the electrostatic chuck 154 can be yttria-coated ceramic components and have exposed yttria-containing coatings 166. The wall of the chamber 150 and substrate support 152 below the chamber liner 164 can also be yttria-coated ceramic components, as shown in FIG. 4. Any or all of these components, as well as any other plasma-exposed components can be yttria-coated ceramic components.

The reactor components can also be used in a high-density oxide etch process. An exemplary oxide etch reactor is the TCP 9100™ plasma etch reactor available from Lam Research Corporation of Fremont, Calif. In the TCP 9100™ reactor, the gas distribution plate is a circular plate situated directly below the TCP™ window, which is also the vacuum sealing surface at the top of the reactor in a plane above and parallel to a substrate being processed. A gas distribution ring feeds gas from a source into the space defined by the gas distribution plate, an inside surface of a window underlying an antenna in the form of a flat spiral coil supplying RF energy into the reactor, and the gas distribution ring. The gas distribution plate contains holes which extend through the plate. The gas distribution plate material is dielectric to enable coupling of this RF power through the gas distribution plate into the reactor. Further, it is desirable for the material of the gas distribution plate to be highly resistant to chemical sputter-etching in environments, such as oxygen or a hydro-fluorocarbon gas plasma in order to avoid breakdown and the resultant particle generation associated therewith.

Figure 5:
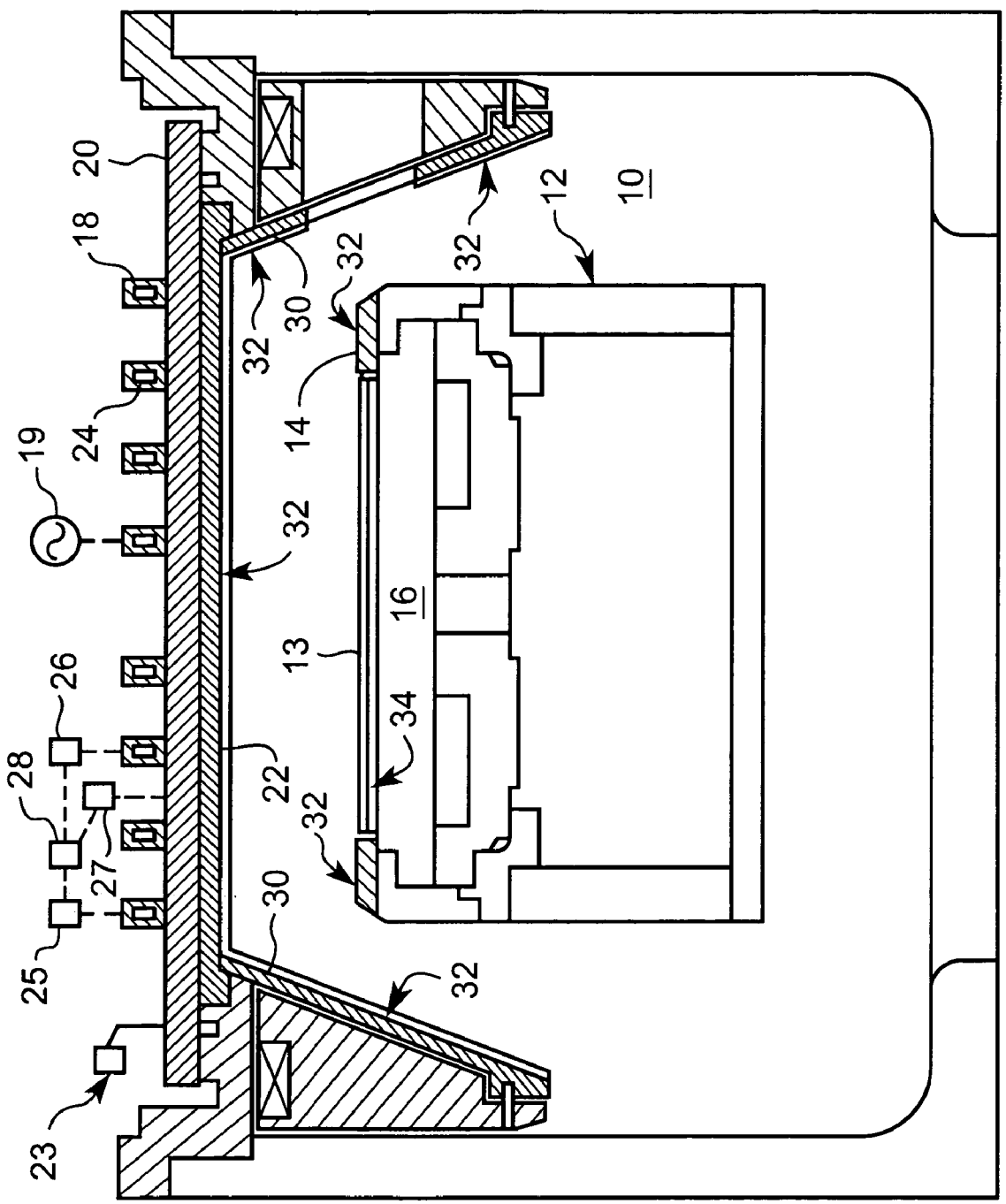
FIG. 5 shows a high plasma-density oxide etch chamber containing embodiments of yttria-coated ceramic components.

FIG. 5 illustrates a plasma reactor of this type. The reactor comprises a plasma chamber 10 that includes a substrate holder 12 having an electrostatic chuck 34, which provides a clamping force to a substrate 13, and an RF bias to a substrate. The substrate can be back-cooled using a heat transfer gas. A focus ring 14 confines plasma in an area above the substrate. A source of energy for maintaining a high density (e.g., $10^{11}$–$10^{12}$ ions/cm$^3$) plasma in the chamber, such as an antenna 18, powered by a suitable RF source to provide a high density plasma is disposed at the top of the plasma chamber 10. The chamber includes suitable vacuum pumping apparatus for maintaining the interior of the chamber at a desired pressure (e.g., below 50 mTorr, typically 1–20 mTorr).

A substantially planar dielectric window 20 is provided between the antenna 18 and the interior of the plasma processing chamber 10 and forms a vacuum wall at the top of the processing chamber 10. A gas distribution plate 22 is beneath window 20 and includes openings for delivering process gas from the gas supply 23 to the chamber 10. A conical or cylindrical liner 30 extends from the gas distribution plate and surrounds the substrate holder 12. The antenna 18 can optionally be provided with a channel 24 through which a heat transfer fluid is circulated via inlet and outlet conduit 25, 26.

In operation, a semiconductor substrate, such as a silicon wafer, is positioned on the substrate holder 12 and held in place by an electrostatic chuck 34. Process gas is supplied to the vacuum processing chamber 10, and a high-density plasma is generated in the space between the substrate and the window 20 by supplying RF power to the antenna 18.

In the apparatus shown in FIG. 5, various reactor components, such as the gas distribution plate 22, the chamber liner 30, the electrostatic chuck 34, and the focus ring 14 can be yttria-coated ceramic components having an exposed yttria-containing coating 32.

The high-density polysilicon and dielectric etch chambers described above are only exemplary plasma etch reactors that can incorporate yttria-coated ceramic components. The components can be used in any etch reactor (e.g., a metal etch reactor), or other type of semi-conductor processing equipment where plasma erosion is a problem.

Other yttria-coated ceramic components can be chamber walls, substrate holders, fasteners, and the like, which are typically exposed to plasma. Other components may not be directly exposed to plasma, but are exposed to corrosive gases, such as gases emitted from processed wafers or the like. Other equipment used in the processing of semiconductor substrates can also be yttria-coated ceramic components. Such equipment can include transport mechanisms, gas supply systems, liners, lift mechanisms, load locks, door mechanisms, robotic arms, fasteners, and the like.

While the invention has been described in detail with reference to specific embodiments thereof, it will be apparent to those skilled in the art that various changes and modifications can be made, and equivalents employed, without departing from the scope of the appended claims.

What is claimed is:

1. A yttria-coated ceramic component of a semiconductor material processing apparatus, comprising:
    a substrate comprising a ceramic material;
    a thermal-sprayed first yttria-containing coating on at least one surface of the substrate; and
    a bond layer comprising a multi-phase oxide including the ceramic material and yttria at an interface between the substrate and the first yttria-containing coating, the bond layer having been formed by co-sintering the substrate and the as-thermal sprayed first yttria-containing coating;
    wherein (i) the first yttria-containing coating includes an exposed surface that has been treated by a plasma conditioning treatment to reduce particles of yttria attached to the exposed surface after the co-sintering, or (ii) the component further comprises an as-thermal sprayed second yttria-containing coating on the sintered first yttria-containing coating and covering the particles of yttria attached to the exposed surface; and
    wherein when (i), the first yttria-containing coating has a porosity of less than about 20%, a crystal structure that is from about 95% to about 100% cubic, and a bond strength of from about 200 ksi to about 400 ksi; and when (ii), the first yttria-containing coating and the second yttria-containing coating have a porosity of less than about 20%, a crystal structure that is from about 95% to about 100% cubic, and a bond strength of from about 200 ksi to about 400 ksi.

2. The component of claim 1, wherein the component is selected from the group consisting of a dielectric window, chamber wall, chamber liner, substrate support, baffle, gas distribution plate, plasma confinement ring, nozzle, fastener, heating element, plasma focus ring, chuck, and a plasma screen, and/or the semiconductor material processing apparatus comprises a plasma etcher.

3. The component of claim 1, wherein the substrate comprises a ceramic material selected from the group consisting of alumina, quartz, zirconia, silicon carbide, silicon nitride, boron carbide, boron nitride, aluminum nitride, and mixtures thereof.

4. The component of claim 1, wherein the component includes the second yttria-containing coating, and the first yttria-containing coating and the second yttria-containing coating comprise an oxide, carbide, nitride, boride and/or carbonitride of at least one element selected from the group consisting of La, Ce, Pr, Nd, Pm, Sm, Eu, Gd, Tb, Dy, Ho, Er, Tm, Yb and Lu.

5. The component of claim 1, wherein the component includes the second yttria-containing coating, and the first yttria-containing coating and the second yttria-containing coating are disposed on the entire outer surface of the substrate.

6. The component of claim 1, wherein the component includes the second yttria-containing coating, and the first yttria-containing coating and the second yttria-containing coating consist essentially of yttria.

7. The component of claim 1, wherein the component includes the second yttria-containing coating which includes an exposed surface having a roughness effective to enhance adhesion of polymer particles that deposit on the exposed surface.

8. The component of claim 1, wherein:
the substrate consists essentially of alumina;
the first coating consists essentially of yttria;
the bond layer comprises yttrium aluminum garnet; and
the component includes the second yttria-containing coating which consists essentially of yttria.

9. A semiconductor material processing apparatus comprising at least one component according to claim 1.

10. A method of processing a semiconductor material in a semiconductor material processing apparatus, comprising processing a semiconductor material with a plasma in a plasma chamber of a semiconductor material processing apparatus which contains at least one component according to claim 1.

11. The method according to claim 10, wherein the processing comprises plasma etching a polysilicon semiconductor material in the plasma chamber.

* * * * *